(12) United States Patent
Coones et al.

(10) Patent No.: US 9,230,847 B2
(45) Date of Patent: Jan. 5, 2016

(54) ENGINEERED SUBSTRATE ASSEMBLIES WITH THERMALLY OPAQUE MATERIALS, AND ASSOCIATED SYSTEMS, DEVICES, AND METHODS

(71) Applicant: Micron Technology, Inc., Boise, ID (US)

(72) Inventors: Joseph G. Coones, Boise, ID (US); Jeremy S. Frei, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 14/043,544

(22) Filed: Oct. 1, 2013

(65) Prior Publication Data
US 2015/0090956 A1    Apr. 2, 2015

(51) Int. Cl.
*H01L 29/06*    (2006.01)
*H01L 21/762*   (2006.01)
*H01L 21/683*   (2006.01)

(52) U.S. Cl.
CPC ...... *H01L 21/76251* (2013.01); *H01L 21/6835* (2013.01); *H01L 2221/6835* (2013.01); *H01L 2221/68327* (2013.01); *H01L 2221/68363* (2013.01); *H01L 2221/68368* (2013.01); *H01L 2221/68381* (2013.01)

(58) Field of Classification Search
USPC ............... 257/14, 9, 321, E33.008, E31.033, 257/E29.069, E29.072
See application file for complete search history.

(56) References Cited

U.S. PATENT DOCUMENTS

2006/0185582 A1* 8/2006 Atwater et al. ................ 117/89
2006/0255341 A1* 11/2006 Pinnington et al. ............ 257/79

* cited by examiner

Primary Examiner — Timor Karimy
(74) Attorney, Agent, or Firm — Perkins Coie LLP

(57) ABSTRACT

Engineered substrates having thermally opaque materials for preventing transmission of radiative energy during epitaxial growth processes and for separating substrates from epitaxially grown semiconductor structures and associated systems and methods are disclosed herein. In several embodiments, for example, an engineered substrate can be manufactured by forming a thermally opaque material at an upper surface of a handle substrate and bonding an epitaxial formation structure on the handle substrate such that the thermally opaque material is between the epitaxial formation structure and the handle substrate. In various embodiments, the thermally opaque material at least partially blocks radiative heat transmission between the handle substrate and the epitaxial formation structure, for example, to provide increased accuracy of epitaxy process temperature measurements and/or increased uniformity of epitaxy growth characteristics across the engineered substrate.

13 Claims, 10 Drawing Sheets

US 9,230,847 B2

ENGINEERED SUBSTRATE ASSEMBLIES WITH THERMALLY OPAQUE MATERIALS, AND ASSOCIATED SYSTEMS, DEVICES, AND METHODS

TECHNICAL FIELD

The present technology relates to engineered substrate assemblies having epitaxial templates for forming epitaxial semiconductor materials.

BACKGROUND

Televisions, mobile phones, tablets, digital cameras, MP3 players, and other portable and non-portable electronic devices utilize light-emitting diodes ("LEDs"), organic light-emitting diodes ("OLEDs"), polymer light-emitting diodes ("PLEDs"), and other solid-state transducer ("SST") devices for, e.g., backlighting. SST devices are also used for signage, indoor lighting, outdoor lighting, and other types of general illumination. FIG. 1A is a cross-sectional view of a conventional SST device 10a with lateral contacts. As shown in FIG. 1A, the SST device 10a includes a substrate 20 carrying an LED structure 11 having an active region 14, e.g., containing gallium nitride/indium gallium nitride (GaN/InGaN) multiple quantum wells ("MQWs") between N-type GaN 15 and P-type GaN 16. The SST device 10a also includes a first contact 17 on a forward-facing surface of the P-type GaN 16 and a second contact 19 spaced laterally apart from the first contact 17 on a forward-facing surface of the N-type GaN 15. The first contact 17 typically includes a transparent and conductive material (e.g., indium tin oxide ("ITO")) through which light is emitted from the LED structure 11. FIG. 1B is a cross-sectional view of another conventional SST device 10b in which the first and second contacts 17 and 19 are at opposite sides of the LED structure 11 in a vertical configuration rather than a lateral configuration. In the SST device 10b, the first contact 17 typically includes a reflective and conductive material (e.g., aluminum) to direct light toward the N-type GaN 15.

One difficulty of forming SST devices is that manufacturing the various semiconductor materials occurs at elevated temperatures. For example, GaN materials (e.g., the N-type GaN 15 or the P-type GaN 16) can be formed by epitaxial growth processes that use elevated temperatures to facilitate growth. In many instances, the elevated temperatures are difficult to control and can lead to uneven film growth and material defects.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. For ease of reference, throughout this disclosure identical reference numbers are used to identify similar or analogous components or features, but the use of the same reference number does not imply that the parts should be construed to be identical. Indeed, in many examples described herein, the identically-numbered parts are distinct in structure and/or function. Furthermore, the same shading may be used to indicate materials in a cross section that can be compositionally similar, but the use of the same shading does not imply that the materials should be construed to be identical.

DETAILED DESCRIPTION

Specific details of several embodiments relating to semiconductor devices having engineered substrates with thermally opaque materials are described below. The term "semiconductor device" generally refers to a solid-state device that includes semiconductor material. Although described herein in the context of SST devices, embodiments of the present technology can also include other types of semiconductor devices, such as logic devices, memory devices, and diodes, among others. Further, the term "semiconductor device" can refer to a finished device, an assembly, or another structure at various stages of processing before becoming a finished device. The term "SST" generally refers to solid-state components that include a semiconductor material as the active medium to convert electrical energy into electromagnetic radiation in the visible, ultraviolet, infrared, and/or other spectra. For example, SSTs include solid-state light emitters (e.g., LEDs, laser diodes, etc.) and/or other sources of emission other than electrical filaments, plasmas, or gases. SSTs can also include solid-state components that convert electromagnetic radiation into electricity.

Depending upon the context in which it is used, the term "substrate" can refer to a wafer-level substrate or to a singulated, die-level substrate. Also, unless the context indicates otherwise, structures disclosed herein can be formed using conventional semiconductor-manufacturing techniques. Materials can be removed, for example, using plasma etching, wet etching, chemical-mechanical planarization ("CMP"), or other suitable techniques. Similarly, materials can be deposited, for example, using chemical vapor deposition, physical vapor deposition, atomic material deposition, spin coating, and/or other suitable techniques. Also, materials can be patterned, for example, by adding and/or removing materials using one or more mask materials, such as photoresist materials, hard-mask materials, or other suitable materials. Specific details of several embodiments of the present technology relate to semiconductor devices having various device features for achieving a compact footprint. A person skilled in the relevant art will also understand that the technology may have additional embodiments, and that the technology may be practiced without several of the details of the embodiments described below with reference to FIGS. 2-7.

Figure 1A:
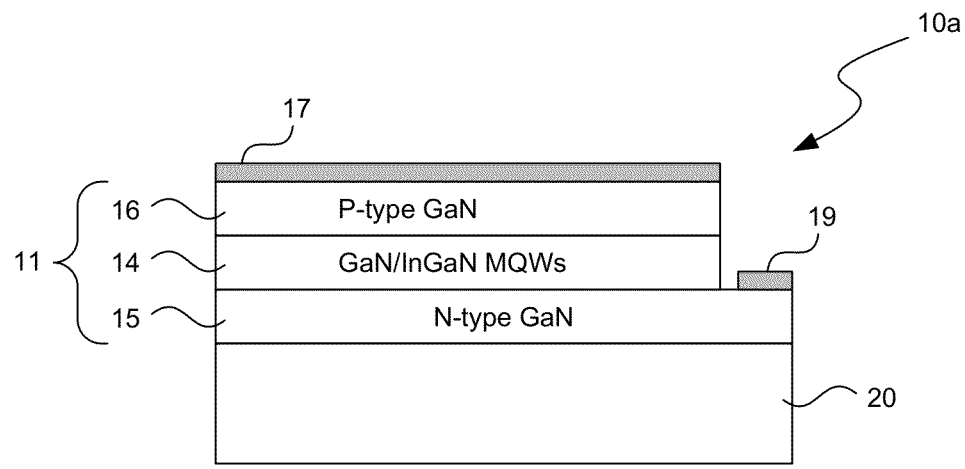
FIGS. 1A and 1B are partially schematic cross-sectional diagrams of SST devices in accordance with the prior art.
Figure 1B:
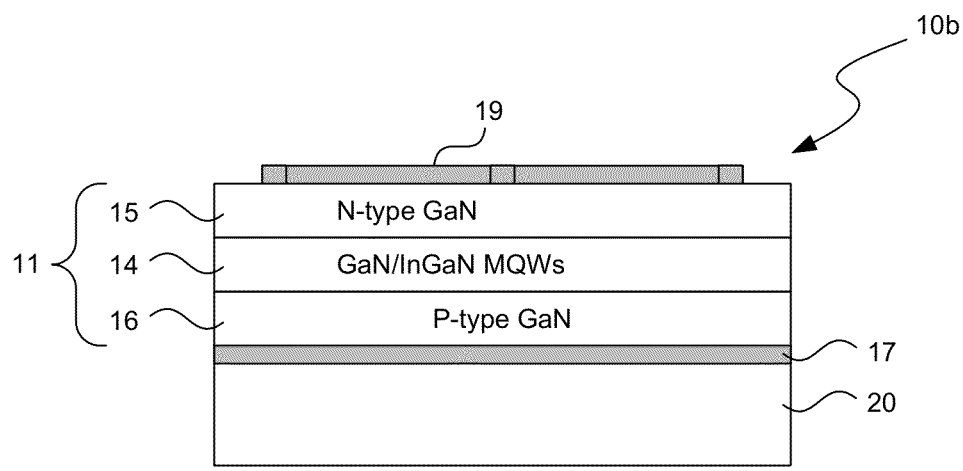
Figure 2:
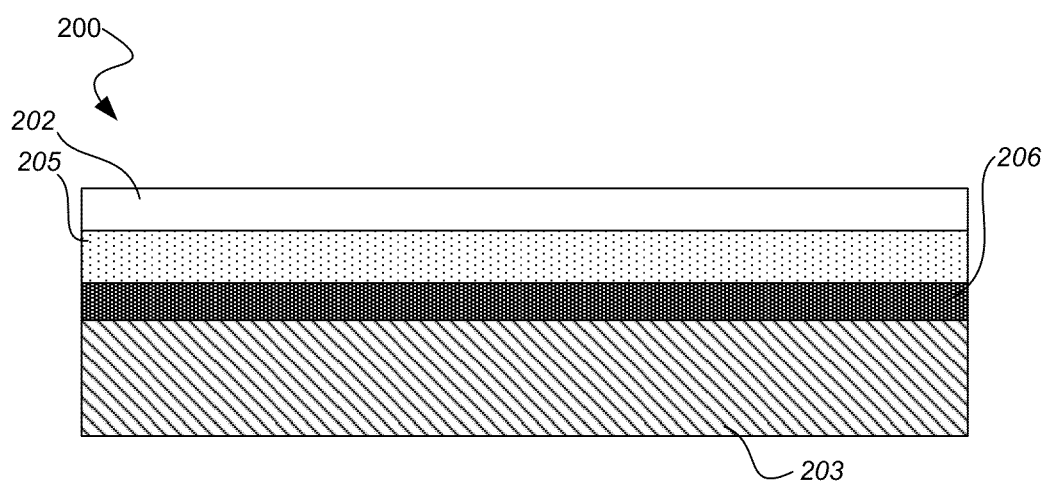
FIG. 2 is a cross-sectional view of an engineered substrate assembly configured in accordance with an embodiment of the present technology.

FIG. 2 is a cross-sectional view of an engineered substrate assembly 200 ("substrate assembly 200") configured in accordance with an embodiment of the present technology. The substrate assembly 200 includes an epitaxial formation structure 202, a handle substrate 203 attached to the epitaxial formation structure 202 through one or more bonding materials 205 (e.g., oxide materials), and a thermally opaque material 206 between the epitaxial formation structure 202 and the handle substrate 203. The epitaxial formation structure 202 can include crystalline materials, such as silicon (Si), at least a portion of which has an Si (1,1,1) crystal orientation, or other suitable materials that facilitate epitaxial growth. The handle substrate 203 can include an insulating material (e.g., ceramic, glass, etc.) and/or other suitable substrate materials (e.g., insulating or non-insulating materials, silicon, etc.). In certain embodiments, the handle substrate 203 may include a polycrystalline ceramic material that has a coefficient of thermal expansion (CTE) substantially similar to the CTE of N-type gallium nitride (GaN) and/or other III-nitrides to reduce thermal stress during epitaxial growth of III-nitrides. In one embodiment, the handle substrate 203 is poly-aluminum nitride (P-AlN). The handle substrate 203 may also include, for example, compositions of $Si_3N_4$, TiN, ZrN, HfN, $SiO_2$, $Al_2O_3$, AlON, TiC, ZrC, HfC, SiC, $Y_2O_3$ and/or other suitable polycrystalline ceramics.

In one aspect of the embodiment of FIG. 2, the thermally opaque material 206 includes a metal or metal alloy having poor radiative heat transmission. In various embodiments, the thermally opaque material 206 can be nearly opaque to infrared (IR) energy in the wavelengths used for temperature measurement by pyrometer. In a specific embodiment, the thermally opaque material 206 includes titanium (Ti) formed on the handle substrate 203 by deposition techniques known in the art (e.g., physical vapor deposition (PVD), chemical vapor deposition (CVD), etc.). In one embodiment, the Ti thermally opaque material 206 is deposited on the handle substrate 206 having a thickness of about 1000-3000 Å. One of ordinary skill in the art will recognize that the substrate assembly 200 can include additional layers of materials (not shown) between the thermally opaque material 206 and handle substrate 203. Accordingly, the thermally opaque material 206 can be deposited in direct contact with the handle substrate 203, or in another embodiment, the thermally opaque material 206 does not directly contact the handle substrate 203.

In operation, the substrate assembly 200 facilitates the growth of epitaxial materials (not shown in FIG. 2) for various types of semiconductor devices. In particular, the epitaxial formation structure 202 can seed particular types of epitaxial growth, such as the epitaxial growth of GaN. The handle substrate 203 can mechanically support the epitaxial formation structure 202 during the epitaxial growth processes. In some embodiments, the handle substrate 203 also provides thermal matching between the epitaxial materials and the substrate assembly 200. As described in greater detail below, the thermally opaque material 206 captures IR radiation (i.e., radiative heat) emitted during the epitaxial growth processes.

Figure 3A:
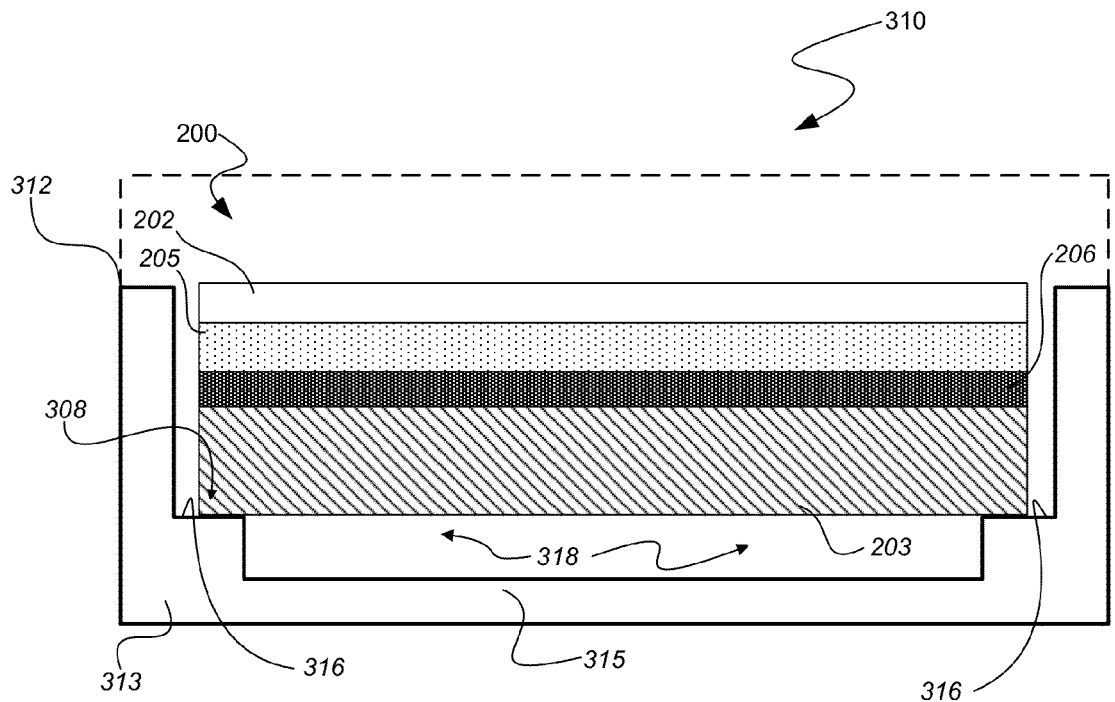
FIGS. 3A-3C are cross-sectional views illustrating a method of forming a semiconductor device with the engineered substrate assembly of FIG. 2 in accordance with embodiments of the present technology.
Figure 3B:
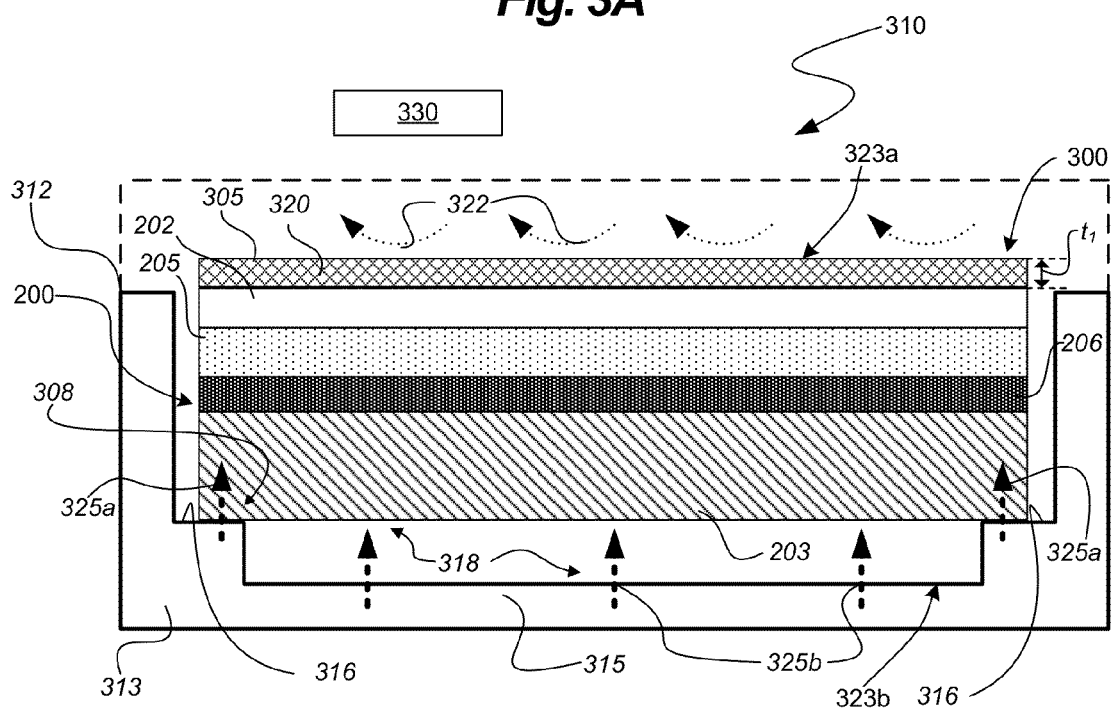
Figure 3C:
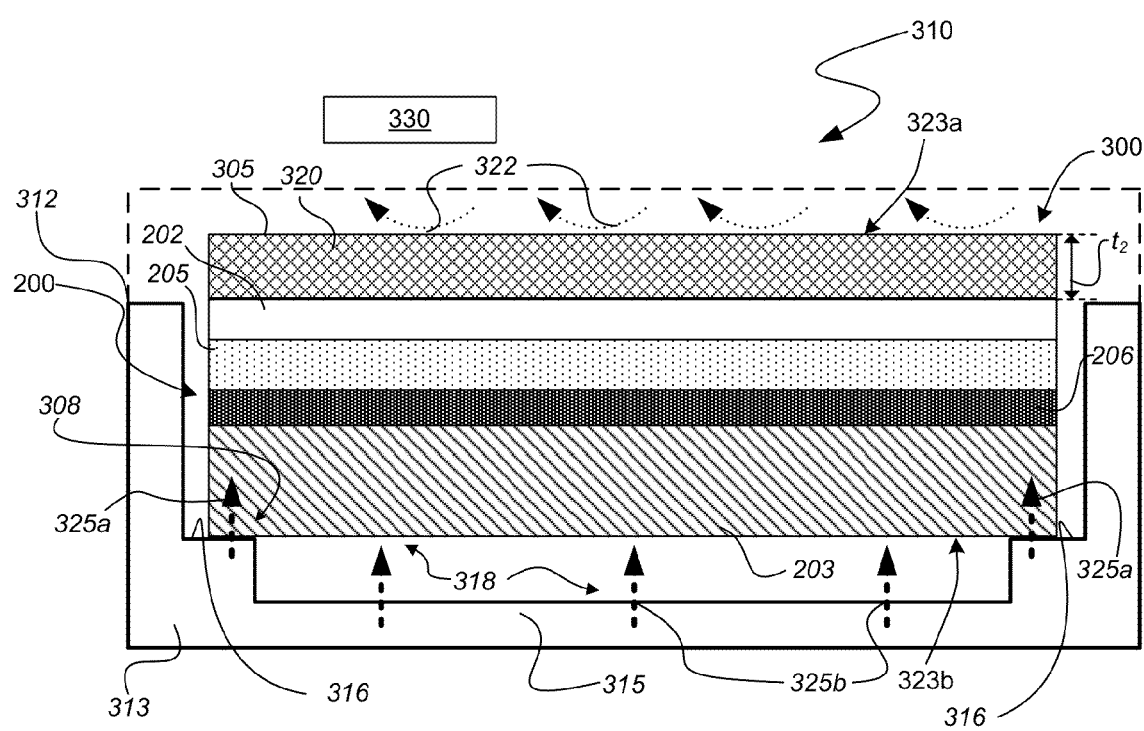

FIGS. 3A-3C are cross-sectional views illustrating a method of forming a semiconductor structure 300 (FIGS. 3B and 3C) with the substrate assembly 200 (FIG. 2) in accordance with embodiments of the present technology. As shown in FIG. 3A, the substrate assembly 200 is positioned within an epitaxial reactor 310. The reactor 310 includes a chamber 312 having a lower assembly 313 with a base 315 and carrier surfaces 316 spaced apart from the base 315 (e.g., above the base 315). The carrier surfaces 316 carry the substrate assembly 200 at outer edges 308. In this position, the substrate assembly 200 and the base 315 define a pocket 318 through which heat and process gases can flow during operation of the reactor 310. Although not shown for purposes of clarity, the reactor 310 can includes other components such as a heater, gas supplies, gas ports, valves, controller electronics, etc.

FIG. 3B shows the substrate assembly 200 in the chamber 312 after an epitaxial material 320 has been grown on the epitaxial formation structure 202 to a first front-side level $t_1$ above the epitaxial formation structure 202 to form a semiconductor structure 300. FIG. 3C shows the substrate assembly 200 in the chamber 312 during a second portion of epitaxial growth in which the epitaxial material 320 has grown from the first front-side level $t_1$ to a second front-side level $t_2$. Within the epitaxial reactor 310, the semiconductor structure 300 can be formed via metal organic chemical vapor deposition ("MOCVD"), molecular beam epitaxy ("MBE"), liquid phase epitaxy ("LPE"), hydride vapor phase epitaxy ("HVPE"), and/or other suitable epitaxial growth techniques.

Referring to FIGS. 3B and 3C together, the reactor 310 delivers process gases 322 across a first side 323a (e.g., a front side) of the substrate assembly 200 while heat 325 (individually identified as 325a and 325b) is transmitted to a second side 323b (e.g., a back side) of the substrate assembly 200. The heat 325 includes conductive heat 325a that transfers to the substrate assembly 200 through portions of the carrier surfaces 316 that directly contact the outer edges 308 of the substrate assembly 200. The heat 325 also includes radiative heat 325b that transfers through the pocket 318 toward the second side 323b of the substrate assembly 200. Also as shown in FIGS. 3B and 3C, the reactor 310 can also include a pyrometer 330 which intercepts and indirectly measures thermal radiation emitted from the substrate assembly 200 during epitaxial growth of the semiconductor material 320.

In various embodiments, the thermally opaque material 206 is configured to capture radiant heat (e.g., infrared energy) before it radiates through the epitaxial formation structure 202 or epitaxial material 320. In one embodiment, the thermally opaque material 206 is nearly opaque to infrared energy in the wavelengths used for temperature measurement by the pyrometer 330. For example, in one embodiment the thermally opaque material 206 can be titanium (Ti) disposed on the handle substrate 203 at sufficient thickness (e.g., 1000-3000 Å) to absorb the radiative heat 325b transferred through the pocket 318 and through the handle substrate 203. By blocking the transmission of the radiative heat 325b through the epitaxial formation structure 202 and the semiconductor materials 320, the thermally opaque material 206 can improve the accuracy of the pyrometer measurement. Accordingly, the pyrometer 330 can more accurately measure the temperature of the thermally opaque material 206, instead of measuring a conflated temperature of the translucent handle substrate 203 and the lower assembly 313 of the chamber 312 below the substrate assembly 200.

Additionally, as the thermally opaque material 206 captures the radiative heat 325b, the material 206 converts this heat into conductive heat. The converted radiative heat 325b, in combination with the conductive heat 325a that transfers to the substrate assembly 200 through the carrier surfaces 316 of the chamber 312, can be used to heat the epitaxial reactor processes such that the reactor 310 can operate at a lower temperature compared to conventional substrates while still maintaining a desirable temperature at the first side 323a of the substrate assembly 200. Furthermore, because the radiative heat 325b is converted to conductive heat via the thermally opaque material 206, the difference between the heat delivered to the substrate assembly 200 via radiation (e.g., radiative heat 325b) and the heat delivered via conduction (e.g., conductive heat 325a) will be reduced, thereby resulting in a more isothermal substrate assembly 200 with less stress and growth rate inconsistencies across an epitaxial growth surface 305.

In contrast to the substrate assembly 200, conventional substrates are thermally translucent (e.g., high radiative heat transmitivities). Accordingly, the conventional substrates as well as the epitaxial layers that grow on them fail to capture much of the radiant heat produced in the epitaxial chamber (e.g., the radiant heat that is released into the pocket between the base of the chamber and the conventional substrate). Failing to capture such radiant heat contributes to non-uniform temperatures, which can cause non-uniform semiconductor material properties during epitaxial growth. For example, when growing epitaxial semiconductor materials on a conventional substrate, the temperature at the edges of the substrate can vary from the temperatures at the center of the substrate, and this variation can cause inconsistent growth rates and/or different stresses in the epitaxy materials across the epitaxial growth surface during the epitaxial growth process. Furthermore, when measuring the process temperature of the conventional substrate, the accuracy of a pyrometer temperature measurement is reduced because the pyrometer is unable to separately and independently measure the thermal radiation emitted from the conventional substrate from the thermal radiation emitted from the epitaxy chamber components below the substrate. Accordingly, pyrometer temperature measurements of conventional substrates are inflated and/or otherwise unreliable due to the conflation of radiant heat transfer from the chamber and the heat generated by the substrate while epitaxially growing semiconductor materials. Embodiments of the present technology overcome these and other limitations associated with conventional structures.

Referring back to FIG. 3C, when formation of the semiconductor structure 300 is complete, the structure 300 along with the substrate assembly 200 can be removed from the epitaxial reactor 310 for further processing (e.g., addition of metal conductive materials, die singulation, etc.). Typically, the handle substrate is not removed since removal may require additional processing steps that complicate manufacturing and increase manufacturing costs. Rather, the handle substrate is singulated along with the other semiconductor materials when forming individual semiconductor devices. Methods and devices in accordance with embodiments of the present technology, however, can provide several advantages over these and other manufacturing techniques. For example, a method can further or alternatively include removing the thermally opaque material 206 (FIG. 3C) located between the semiconductor structure 300 and the handle substrate 203 to provide mechanical and electrical isolation from the handle substrate 203 as explained below.

Figure 4A:
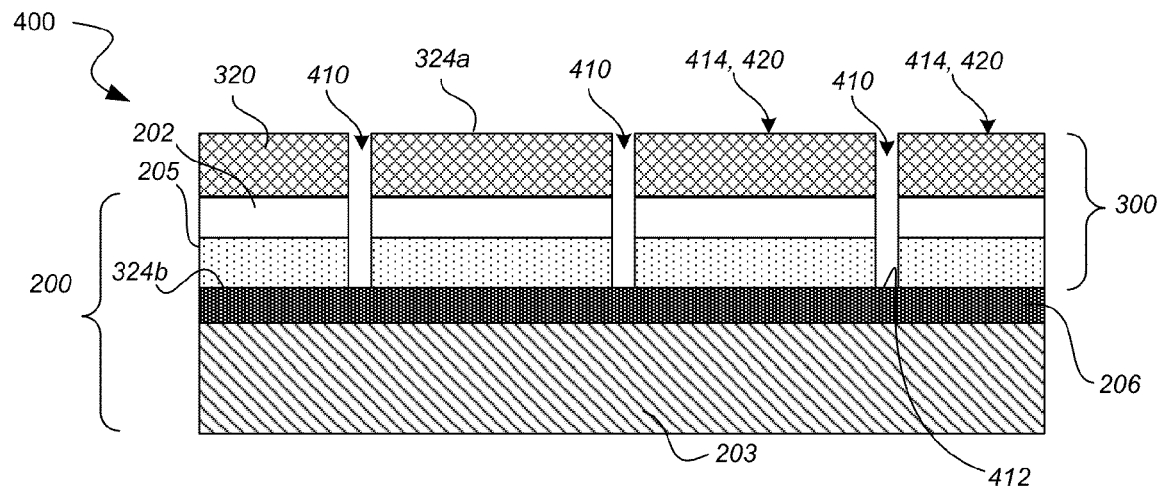
FIGS. 4A-4D are cross-sectional views illustrating a method of forming a semiconductor device that includes the substrate assembly of FIG. 2 in accordance with embodiments of the present technology.
Figure 4B:
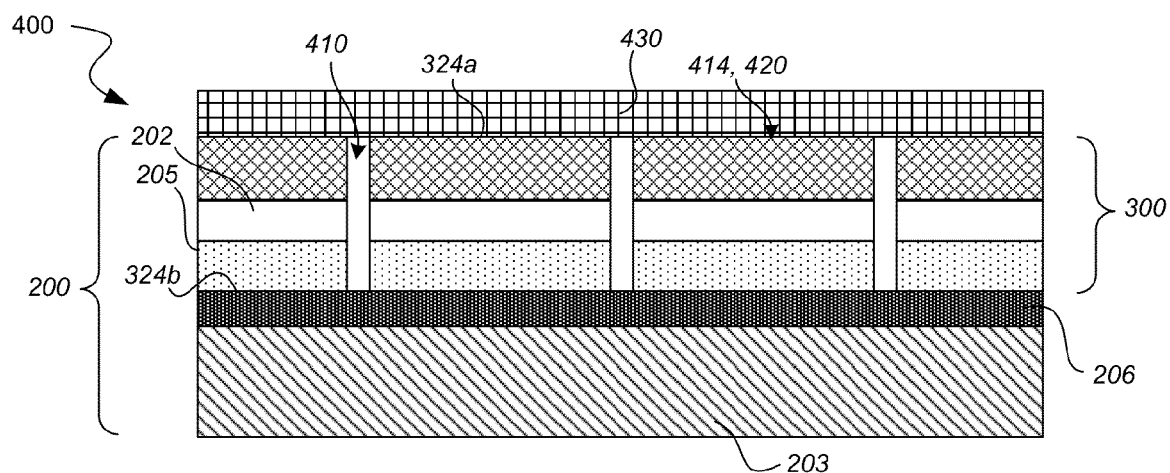
Figure 4C:
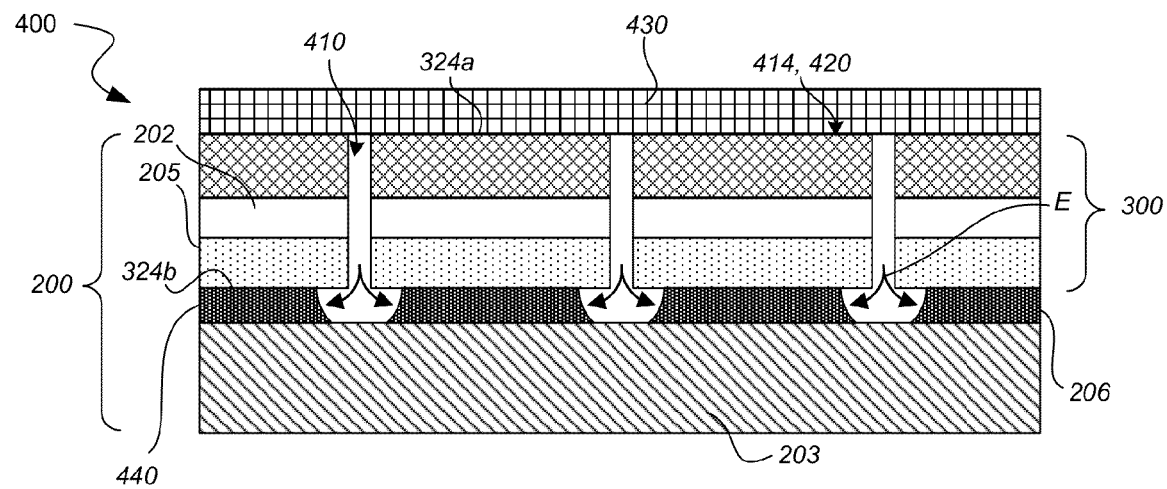

FIGS. 4A-4C are cross-sectional views illustrating a method of forming a semiconductor device assembly 400 (FIGS. 4B-4D) that includes the substrate assembly 200 in accordance with embodiments of the present technology. FIG. 4A shows the substrate assembly 200 after removing material from the semiconductor structure 300 to form openings 410 in the semiconductor structure 300. In particular, the openings 410 can extend from a first side 324a of the semiconductor structure 300 (323a in FIG. 3B) to a second side 324b of the semiconductor structure 300 to expose surfaces 412 of the thermally opaque material 206 through the openings 410. The openings 410 can extend from the first side 324a of the semiconductor structure 300 to a variety of depths within the semiconductor structure 300 or the substrate assembly 200 that result in exposing the surfaces 412 of the thermally opaque material 206. For example, the exposed surfaces 412 can be adjacent the second side 324b of the structure 300 (FIG. 4A). In other embodiments, the exposed surfaces 412 can be at an intermediate depth within the thermally opaque material 206 (not shown) such that the openings 410 at least partially extend into the thermally opaque material 206. In further embodiments, the openings 410 can extend completely through the thermally opaque material 206 (not shown). For example, the openings 410 can be configured to expose a portion of the handle substrate 203 through the openings 410.

In several embodiments, the openings 410 can at least partially define individual mesas 414 in the semiconductor structure 300. For example, the openings 410 can include trenches that isolate the individual mesas 414 from one another. Each mesa 414 can define an individual semiconductor device 420 having one or more integrated circuits or other features. The openings 410 can be produced by methods known in the art, for example by forming a mask over the areas above the individual semiconductor devices 420 and etching (e.g., wet etching, dry etching, etc.) through the exposed portions of the semiconductor structure 300.

FIG. 4B shows a stage of the process of forming the semiconductor device assembly 400 after a transfer structure 430 has been attached to the substrate assembly 200, for example, the first side 324a of the semiconductor structure 300 can be attached to the transfer structure 430 by applying an adhesive (not shown) for at least temporarily binding the substrate assembly 200 to the transfer structure 430 (e.g., a die-attach tape or other suitable carrier structure). In some embodiments, the transfer structure 430 can be porous or otherwise include holes (not shown) through the structure 430 such that liquid or vapor (e.g., etchant liquid or vapor as described below) introduced to the semiconductor device assembly 400 can access the openings 410 below the attached transfer structure 430. The transfer structure 430 is configured to support the individual mesas 414 of the semiconductor structure 300 after the handle substrate 203 has been removed. In general, the transfer structure 430 does not substantially degrade in acidic and/or basic solutions within a certain pH range. For example, the transfer structure 430 is configured such that it does not substantially degrade in the chemical etchant described below with reference to FIGS. 4C and 4D. In other embodiments, however, the transfer structure 430 can be omitted, and thus the manufacturing stage at FIG. 4B can likewise be omitted. For example, the transfer structure 430 can be omitted in embodiments in which the semiconductor structure 300 is not decoupled from the handle substrate 203.

FIG. 4C shows the semiconductor device assembly 400 of FIG. 4B after exposing the assembly 400 to an etching media such that the etchant (drawn as arrows "E" in FIG. 4C) removes at least a portion of the thermally opaque material 206 from the interface between the handle substrate 203 and the second side 324b of the semiconductor structure 300. The etching media (e.g., a liquid etchant, a vapor etchant, a gas etchant, etc.) can flow through the openings 410 (e.g., accessed through pores or through holes (not shown) disposed in the transfer structure 430) as well as from outer edges 440 of the assembly 400 such that the etchant E can sufficiently undercut the handle substrate 203 below the semiconductor structure 300 to release the handle substrate 203 from the semiconductor device assembly 400. As shown, the etchant E can access each side of the individual semiconductor devices 420 via the openings 410 between the individual mesas 414 and/or from the outer edges 440. In one embodiment, the semiconductor device can be placed into a bath of liquid chemical etchant (e.g., a liquid containing hydrofluoric acid, buffers, additives, etc.) suitable for wet etching, or, in another embodiment, the semiconductor device can be placed into a chamber containing a vapor etchant, such as vapor hydrofluoric acid or other vaporized acid. The etching media can selectively etch the thermally opaque material 206 without etching the handle substrate 203 or any portions of the semiconductor structure 300. For example and in one embodiment, an etchant E can dissolve the thermally opaque material 206 at a first etch rate and dissolve the handle substrate 203 at a second etch rate less than the first etch rate. The higher etch rate of the thermally opaque material 206 can be advantageous because it can be etched in less time than what is required for removal of the handle substrate 203 or a lower concentration of etchant E can be used than what is required to remove the handle substrate 203. As such, damage to the handle substrate 203 can be minimal or eliminated when etching the sacrificial thermally opaque material 206.

Figure 4D:
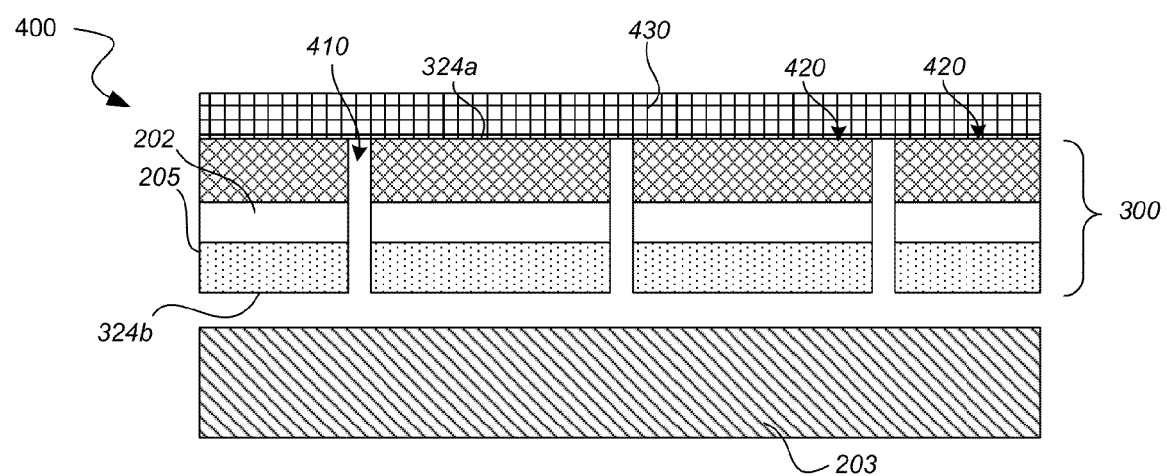

FIG. 4D shows the handle substrate 203 after it has been released from the semiconductor device assembly 400. Once released, the handle substrate 203 can be recycled and used to form other semiconductor materials and devices. Alternatively, the handle substrate 203 can be discarded depending on the type or life-cycle of the handle substrate 203. For example, the handle substrate 203 can be discarded if it has become too thin, contaminated, and/or cycled more than a pre-determined number of times. In other embodiments, the handle substrate 203 can be removed by an alternative process, such as by backgrinding, etching, or chemical and mechanical polishing (e.g., CMP).

Figure 5A:
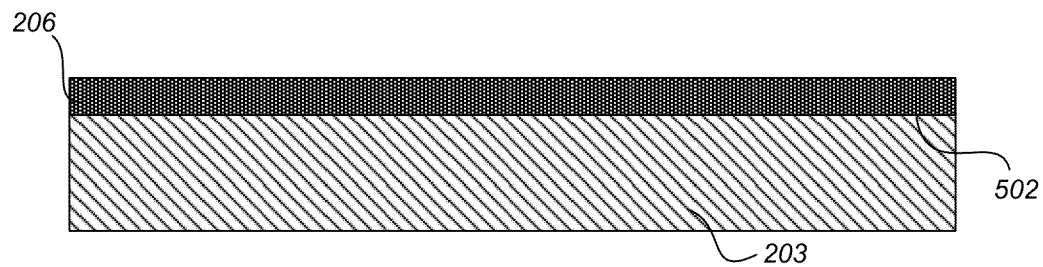
FIGS. 5A-5D are cross-sectional views illustrating a method of forming a substrate assembly that includes a thermally opaque material in accordance with embodiments of the present technology.

FIGS. 5A-5D are cross-sectional views illustrating a method of forming a substrate assembly, such as the engineered substrate assembly 200 shown in FIG. 2, that includes a thermally opaque material 206 in accordance with embodiments of the present technology. FIG. 5A illustrates a stage in the process of forming the substrate assembly 200 (FIG. 2) having a handle substrate 203 and after the thermally opaque material 206 has been formed on an upper surface 502 of the handle substrate 203. In certain embodiments, the thermally opaque material 206 includes titanium (Ti) and can be formed by deposition techniques known in the art (e.g., physical vapor deposition (PVD) or chemical vapor deposition (CVD), etc.).

Figure 5B:
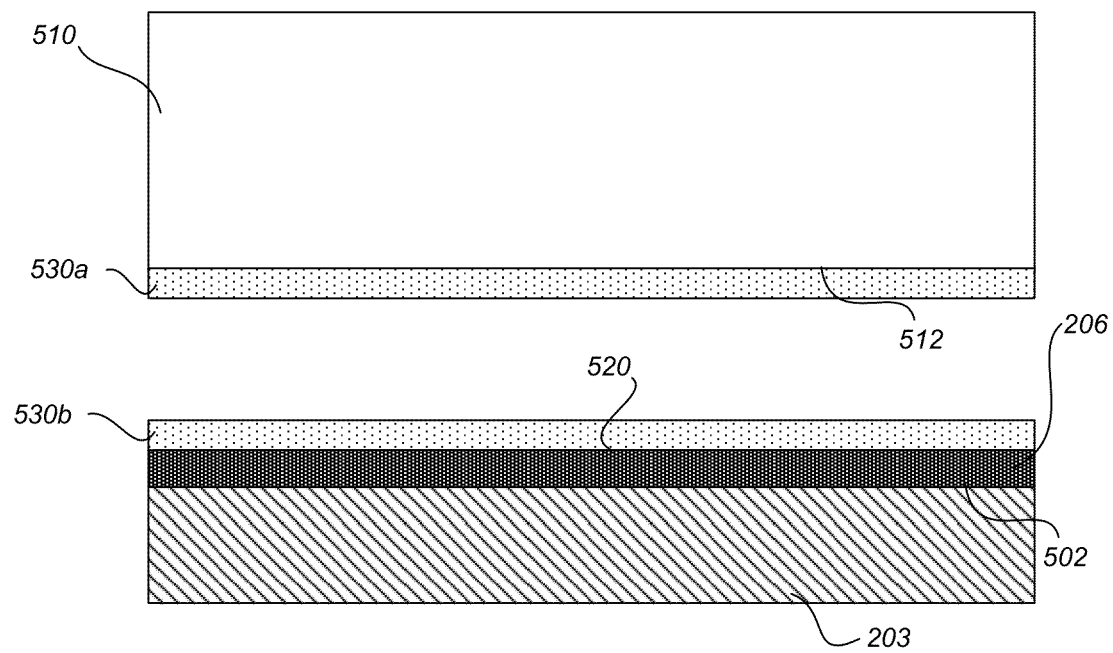
Figure 5C:
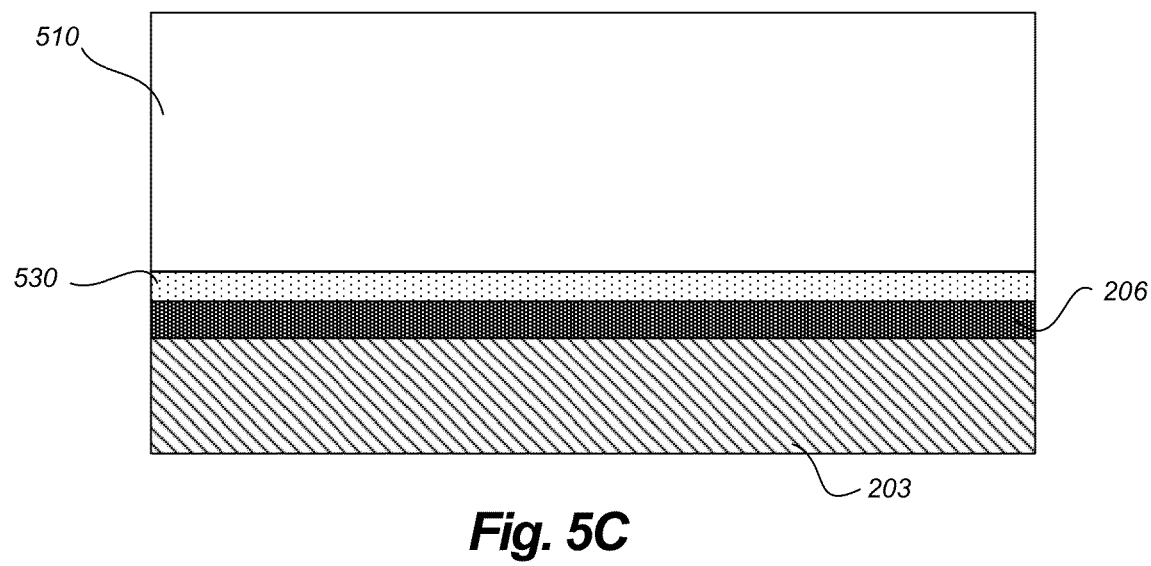
Figure 5D:
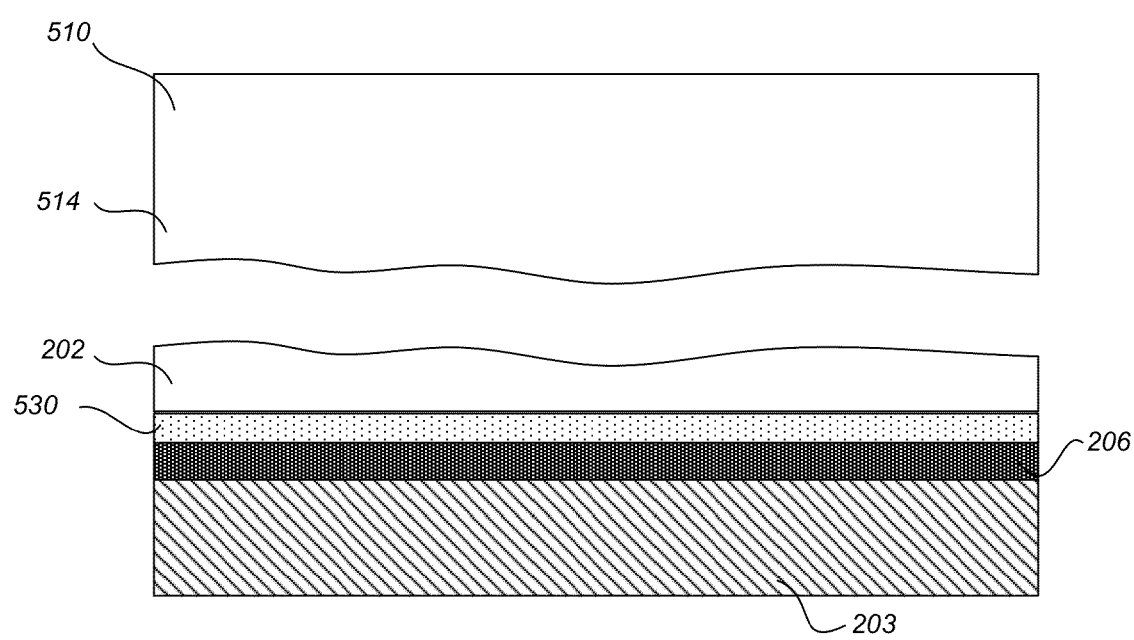

FIGS. 5B-5D illustrate steps in the process of forming the epitaxial formation structure 202 (FIG. 2) on the handle substrate 203 using conventional processes that include providing a donor substrate 510 that includes material that facilitates epitaxial growth of III-nitride structures (e.g., an LED structure) (FIG. 5B). For example, the donor substrate 510 can include Si, at least a portion of which has an Si (1,1,1) crystal orientation, or other suitable materials that facilitate epitaxial growth of semiconductor materials (e.g., GaN). As shown in FIG. 5B, first and second portions of bonding material 530a and 530b (collectively referred to as 530) can be applied to a lower surface 512 of the donor substrate 510 and/or an upper surface 520 of the thermally opaque material 206, respectively. In some embodiments, only a single portion (e.g., 530a or 530b) may be applied. For example, the process can include only applying the first portion of bonding material 530a to the lower surface 512 of the donor substrate 510. The bonding material 530 can comprise materials that grow native oxides (e.g., amorphous polymers, amorphous silicon, oxides, etc.). For example, the bonding material 530 can include an oxide of silicon, such as silicon dioxide ($SiO_2$). The bonding material 530 can be formed on the donor substrate 510 and/or the thermally opaque material 206 using PVD, CVD, ALD, spin on coating and/or other suitable formation methods. In some embodiments, the bonding material 530 may undergo an additional polishing step (e.g., using chemical-mechanical polishing ("CMP")) (not shown) to thin the bonding material 530 and to form a substantially smooth surface and/or to reduce a thickness of the bonding material 530 to about 250-350 Å (e.g., 300 Å).

FIG. 5C illustrates a step in the process for forming the epitaxial formation structure 202 that includes bonding the donor substrate 510 to the handle substrate 203 wherein the thermally opaque material 206 and the bonding material 530 are between the handle substrate 203 and the donor substrate 510. FIG. 5D illustrates a step in the process that includes removing an upper portion 514 of the donor substrate 510 via exfoliation leaving the epitaxial formation structure 202 bonded to the handle substrate 203. The epitaxial formation structure 202 can be further smoothed or polished (not shown) to form a smooth upper surface (as shown in FIG. 2) and/or to reduce a thickness of the epitaxial formation structure 202.

Figure 6:
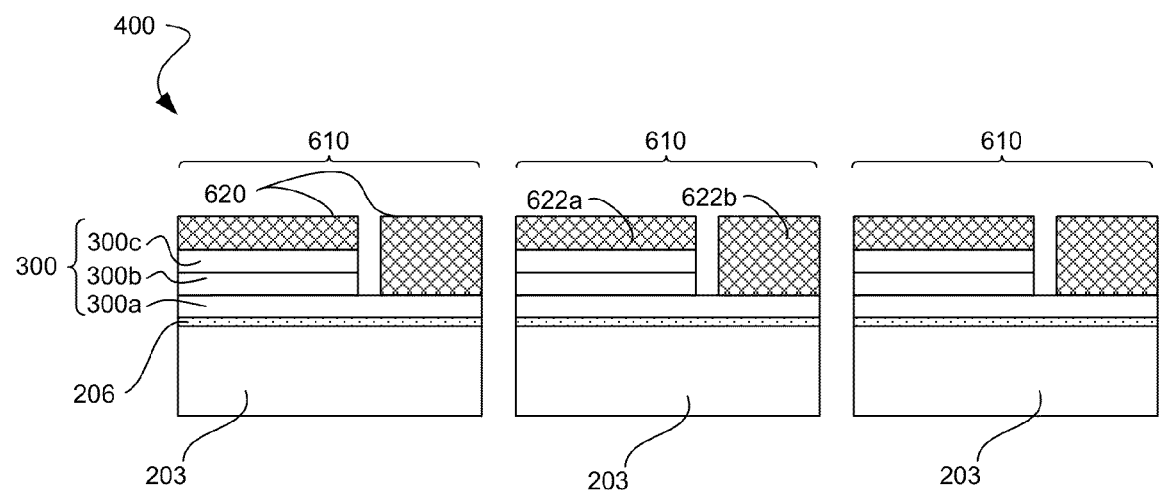
FIG. 6 is a cross-sectional view of an SST structure incorporating a semiconductor device in accordance with embodiments of the present technology.

FIG. 6 is a cross-sectional view of the semiconductor device assembly 400 having SST structures 610 in accordance with a further embodiment of the present technology. The individual SST structures 610 can include a conductive material 620 and the semiconductor structure 300, and the semiconductor structure 300 can include first through third semiconductor materials 300a-300c. In some embodiments, the SST structure 610 can be configured to emit and/or receive light in the visible spectrum (e.g., from about 390 nm to about 750 nm) through the handle substrate 203 if not removed. In other embodiments, the SST structure 610 can also be configured to emit and/or receive light in the infrared spectrum (e.g., from about 1050 nm to about 1550 nm) and/or in other suitable spectra provided that either 1) the handle substrate 203 is optically transmissive to such spectra, or 2) the handle substrate 203 is removed from the semiconductor device assembly 400 as shown in FIG. 4D.

In one embodiment, the first semiconductor material 300a can include an N-type semiconductor (e.g., an N-type gallium nitride ("N-GaN")) and the third semiconductor material 300c can include a P-type semiconductor material (e.g., a P-type gallium nitride ("P-GaN")). In some embodiments, the first and third semiconductor materials 300a and 300c can individually include at least one of gallium arsenide (GaAs), aluminum gallium arsenide (AlGaAs), gallium arsenide phosphide (GaAsP), gallium (III) phosphide (GaP), zinc selenide (ZnSe), boron nitride (BN), aluminum gallium nitride (AlGaN), and/or other suitable semiconductor materials. The second semiconductor material 300b can define an "active region" that includes a single quantum well ("SQW"), MQWs, and/or a bulk semiconductor material. The term "bulk semiconductor material" generally refers to a single grain semiconductor material (e.g., InGaN) with a thickness between approximately 10 nanometers and approximately 500 nanometers. In certain embodiments, the active region can include an InGaN SQW, GaN/InGaN MQWs, and/or an InGaN bulk material. In other embodiments, the active region can include aluminum gallium indium phosphide (AlGaInP), aluminum gallium indium nitride (AlGaInN), and/or other suitable materials or configurations.

The SST structure 610 can be formed via metal organic chemical vapor deposition ("MOCVD"), molecular beam epitaxy ("MBE"), liquid phase epitaxy ("LPE"), hydride vapor phase epitaxy ("HVPE"), and/or other suitable epitaxial growth techniques as described above with respect to FIGS. 3A-3C. In other embodiments, the SST structure 610 can also include other suitable components, such as a buffer material that facilitates the formation of the semiconductor structure 300 on the engineered substrate assembly 200 (FIG.

2). In further embodiments, the SST structure 610 can include additional bonding and seed layers to facilitate bonding and/or epitaxial growth.

Once formed, the SST structure 610 can be integrated into an SST device. For example, first and second contacts 622a and 622b of the SST structure 610 can be directly attached to a printed circuit board or other suitable substrate. Also, other features can be formed on or integrated into the SST structure, such as a lens (not shown) over the handle substrate 203 of the SST structure 610, an anti-reflective coating or a mirror, and/or other suitable mechanical/electrical components (not shown).

Figure 7:
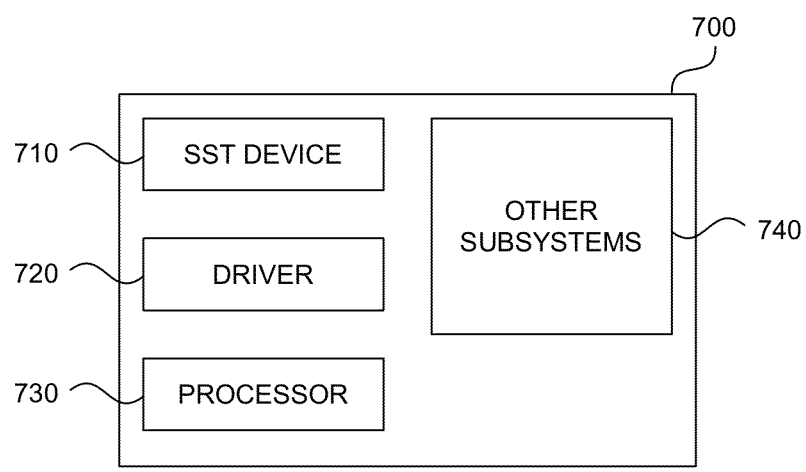
FIG. 7 is a schematic view of a system that includes a light emitter configured in accordance with embodiments of the present technology.

The substrate assemblies and semiconductor devices described above with reference to FIGS. 2-6 can be used to form SST devices, SST structures, and/or other semiconductor structures that are incorporated into any of a myriad of larger and/or more complex devices or systems, a representative example of which is system 700 shown schematically in FIG. 7. The system 700 can include one or more semiconductor/SST devices 710, a driver 720, a processor 730, and/or other subsystems or components 740. The resulting system 700 can perform any of a wide variety of functions, such as backlighting, general illumination, power generations, sensors, and/or other suitable functions. Accordingly, representative systems can include, without limitation, hand-held devices (e.g., mobile phones, tablets, digital readers, and digital audio players), lasers, photovoltaic cells, remote controls, computers, and appliances. Components of the system 700 may be housed in a single unit or distributed over multiple, interconnected units (e.g., through a communications network). The components of the system 700 can also include local and/or remote memory storage devices, and any of a wide variety of computer readable media.

From the foregoing, it will be appreciated that specific embodiments of the disclosure have been described herein for purposes of illustration, but that various modifications may be made without deviating from the disclosure. For example, the engineered substrate assembly 200 shown in FIG. 2 includes a thermally opaque material 206 between and directly adjacent to the handle substrate 203 and the bonding material 205. However, in other embodiments, the engineered substrate assembly 200 in accordance with the present technology can include additional layers of materials between the thermally opaque material 206 and the bonding material 205 and/or handle substrate 203. In addition, certain aspects of the disclosure described in the context of particular embodiments may be combined or eliminated in other embodiments. For example, in some embodiments, the handle substrate 203 can be singulated with the individual semiconductor devices 420 shown in FIG. 4 and the process step of removing the handle substrate 203 can be avoided. Further, while advantages associated with certain embodiments have been described in the context of those embodiments, other embodiments may also exhibit such advantages. Not all embodiments need necessarily exhibit such advantages to fall within the scope of the present disclosure. Accordingly, the disclosure and associated technology can encompass other embodiments not expressly shown or described herein.

We claim:

1. A substrate assembly, comprising:
   a handle substrate;
   an thermally opaque material on the handle substrate;
   an epitaxial formation structure on the thermally opaque material; and
   an epitaxial material formed on the epitaxial formation structure;
   wherein the thermally opaque material is configured to at least partially block radiative heat transmission between the handle substrate and the epitaxial formation structure,
   wherein the thermally opaque material is sacrificial and can be removed via chemical etch at a first etch rate, and the handle substrate is a reusable substrate that dissolves at a second etch rate, the second etch rate being less than the first etch rate.

2. The substrate assembly of claim 1 wherein:
   the handle substrate comprises a polycrystalline ceramic;
   the thermally opaque material comprises titanium;
   the epitaxial formation structure comprises a silicon material having a Si(1,1,1) crystal orientation; and
   the substrate assembly further comprises a bonding material between the epitaxial formation structure and the thermally opaque material.

3. The substrate assembly of claim 1 wherein the handle substrate comprises poly-aluminum nitride.

4. The substrate assembly of claim 1 wherein the thermally opaque material includes titanium at a thickness of about 1000-3000 Å.

5. The substrate assembly of claim 1 wherein the handle substrate is transmissive to radiative heat and the thermally opaque material is configured to convert radiative heat to conductive heat.

6. A semiconductor device assembly, comprising:
   an engineered substrate assembly including a handle substrate, a thermally opaque material on the handle substrate, and an epitaxial formation structure on the thermally opaque material, wherein the thermally opaque material comprises titanium (Ti) configured to capture infrared energy; and
   an epitaxial material formed on the epitaxial formation structure, wherein the epitaxial material comprises:
   a first semiconductor material formed on the epitaxial formation structure, the first semiconductor material comprising N-type gallium nitride (GaN),
   an active region on the first semiconductor material, the active region comprising at least one of a bulk indium gallium nitride (InGaN), an InGaN single quantum well, and Gan/InGaN multiple quantum wells, and
   a second semiconductor material in the active region, the second semiconductor material comprising P-type GaN.

7. The semiconductor device assembly of claim 6 wherein the epitaxial material is a light emitting diode (LED) device.

8. The semiconductor device of claim 6 wherein the thermally opaque material includes a metal having low conductivity of radiative heat.

9. The semiconductor device assembly of claim 6 wherein the handle substrate is a polycrystalline ceramic having a coefficient of thermal expansion (CTE) substantially similar to a CTE of gallium nitride (GaN).

10. The semiconductor device assembly of claim 6 wherein the epitaxial formation structure is bonded to the thermally opaque material, and wherein the epitaxial formation structure comprises silicon having a Si (1,1,1) crystal orientation.

11. The semiconductor device assembly of claim 6 wherein:
   the substrate assembly has a first side and a second side opposite the first side;
   the epitaxial formation structure is at the first side; and
   the thermally opaque material is configured to prevent transmission of radiative heat from the second side to the first side.

12. The semiconductor device assembly of claim 6 wherein the thermally opaque material is configured to convert the infrared energy to conductive heat.

13. The semiconductor device assembly of claim 6 wherein:
- the substrate assembly has a first side and a second side opposite the first side;
- the epitaxial formation structure is at the first side; and
- the thermally opaque material is configured to absorb infrared energy emitted from an epitaxial carrier structure at the second side and transmit conductive heat to the epitaxial formation structure at the first side.

* * * * *